(12) United States Patent
Saeki

(10) Patent No.: US 6,350,997 B1
(45) Date of Patent: Feb. 26, 2002

(54) SEMICONDUCTOR LIGHT EMITTING ELEMENT

(75) Inventor: Ryo Saeki, Ichikawa (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 09/295,974

(22) Filed: Apr. 21, 1999

(30) Foreign Application Priority Data

Apr. 23, 1998 (JP) .............................................. 10-113666

(51) Int. Cl.⁷ ........................ H01L 33/00; H01L 29/205; H01L 29/207
(52) U.S. Cl. ............................ 257/102; 257/97; 257/99; 372/45
(58) Field of Search ............................. 257/97, 98, 99, 257/102; 372/45

(56) References Cited

U.S. PATENT DOCUMENTS

| | | | | |
|---|---|---|---|---|
| 5,162,878 A | * | 11/1992 | Sasagawa ..................... | 257/98 |
| 5,268,582 A | * | 12/1993 | Kopf ............................ | 257/96 |
| 5,744,828 A | * | 4/1998 | Nozaki ......................... | 257/98 |
| 5,793,062 A | * | 8/1998 | Kish ............................. | 257/98 |
| 5,811,839 A | * | 9/1998 | Shinoyama ................... | 257/102 |
| 5,985,686 A | * | 11/1999 | Jayaraman .................... | 257/98 |
| 6,031,243 A | * | 2/2000 | Taylor .......................... | 257/98 |
| 6,057,562 A | * | 5/2000 | Lee ............................... | 257/99 |
| 6,121,635 A | * | 9/2000 | Watanabe ..................... | 257/102 |

* cited by examiner

Primary Examiner—Jerome Jackson, Jr.
(74) Attorney, Agent, or Firm—Hogan & Hartson, L.L.P.

(57) ABSTRACT

In a semiconductor light emitting element using InGaAlP semiconductors, reduced in operative voltage and increased in optical output, a contact layer doped with a predetermined amount of carbon is provided to reduce the contact resistance at the contact with an ITO electrode because carbon does not readily diffuse like zinc and does not deteriorate the element characteristics. An intermediate band gap layer having an intermediate band gap between those of a contact layer and a cladding layer may be interposed between these layers to alleviate band discontinuity between their valence bands, thereby promote inflow of holes and decrease the element resistance.

19 Claims, 8 Drawing Sheets

SEMICONDUCTOR LIGHT EMITTING ELEMENT

BACKGROUND OF THE INVENTION

This invention relates to a semiconductor light emitting element. More specifically, the invention relates to a semiconductor light emitting element made of InGaAlP materials on an n-type GaAs substrate and including a transparent electrode on its emission surface, which is reduced in operative voltage and increased in optical output by inserting one or both of a carbon-doped p-type GaAlAs layer and p-type GaAs layer between the transparent electrode and a cladding layer.

Semiconductor light emitting elements are widely expanding their field of application to indoor/outdoor displays, railway/traffic signals, compartment/cabin lamps, and so on, because of a number of advantage they have, such as compactness, low power consumption, reliability, for example. Especially, those using as the light emitting layer an InGaAlP material, which is a quaternary compound semiconductor, can be adjusted in composition to emit light in wide wavelength bands from red to green.

In the present application, "InGaAlP" pertains to semiconductors of any composition made by changing mole fractions x and y in the composition formula $In_xGa_yAl_{1-x-y}P$ within the range satisfying $0 \leq x \leq 1$, $0 \leq y \leq 1$, and $(x+y) \leq 1$. That is, mixed crystals such as InGaP, InAlP, InGaAlP, GaP and GaAlP are also grouped into "InGaAlP". Additionally, there are also involved mixed crystals containing arsenic (As) in addition to phosphorus (P) as group V elements.

For years, n-type GaAs substrates using silicon (Si) as the impurity have been typically used as substrates of InGaAlP light emitting diodes (LED).

FIGS. 10 through 12 are cross-sectional views schematically showing InGaAlP semiconductor light emitting elements as comparative examples, which were experimentally made by the Inventor in the course of researches toward the present invention.

The light emitting element 100A shown in FIG. 10 includes an n-type GaAs buffer layer 102, n-type InGaAlP cladding layer 103, InGaAlP active layer 104, p-type InGaAlP cladding layer 105, and ITO (indium tin oxide) transparent electrode 106 sequentially stacked on an n-type GaAs substrate 101, and further formed are a p-side electrode 107 and an n-side electrode 108. The semiconductor layers 101 through 105 are epitaxially grown by metal organic chemical vapor deposition (MOCVD), for example.

In the light emitting element 100B shown in FIG. 11, a p-type GaAlAs current diffusion layer 109 on the p-type cladding layer 105 so that a current injected from the p-side electrode 107 disperses and spreads in a direction parallel to the element surface. The same components as those of the light emitting element shown in FIG. 10 are labeled with common reference numerals, and their explanation is omitted here.

In the light emitting element 100C shown in FIG. 12, a p-type GaAs low-resistance contact layer 110 and the transparent electrode 106 are stacked on the p-type cladding layer 105.

InGaAlP LEDs shown in FIGS. 10 and 12, however, involve serious problems in their operative characteristics. Problems are particularly serious in the structure shown in FIG. 10, and it has not been brought into practice to date. One of reasons of the problems lies in the use of the transparent electrode 106. The purpose of the transparent electrode 106 is to ensure uniform extension of a current along the emission surface and make a uniform light emitting intensity profile. However, the transparent electrode 106 is an n-type semiconductor like ITO (indium tin oxide), for example, and the cladding layer 105 in contact therewith is a p-type semiconductor. Therefore, when a forward voltage is applied to LED 100A, a reverse-biased state is formed between the transparent electrode 106 and the p-type cladding layer 105. As a result, almost no current flows as shown in FIG. 2 as "Comparative Example (1)".

The light emitting element 100C shown in FIG. 12 includes, between the p-type cladding layer 105 and the transparent electrode 106, the p-type GaAs low-resistance contact layer 110 doped with a plenty of zinc (zn) ($\sim 1 \times 10^{20}$ $cm^{-3}$). As a result, the contact resistance decreases, and relatively good current-voltage characteristics are obtained as shown in FIG. 2 as "Comparative Example (3)".

However, here arises another problem caused by doping of a large amount of Zn. Zinc tends to diffuse under heat or current. The large amount of zinc doped into the p-type GaAs layer 110 diffuses not only during crystal growth but also during operation of the element (when a current is supplied), and deteriorates the quality of the active layer 104 for emission, and adversely affects initial characteristics and lifetime characteristics of the element. As a result, as shown in FIG. 7 as "Comparative Example (3)", the element is low in optical output, and rapidly deteriorates toward reducing its lifetime. If the dope amount of zinc is reduced ($1 \times 10^{19}$ $cm^{-3}$ or less), then the p-type GaAs layer 110 loses its function as the low-resistant contact layer, and the element results in involving the same problem of bad current-voltage characteristics.

In the light emitting element 100B shown in FIG. 11, the p-type GaAlAs current diffusion layer 109 is provided instead of a transparent electrode on the emission surface. In the p-type GaAlAs layer 109, mole fraction of Al is increased to transmit light from the active layer 10, and zinc is doped to decrease the resistance. Since a dope amount of zinc of approximately $1 \times 10^{18}$ $cm^{-3}$ is sufficient therefor, the problem malfunction caused by diffusion of zinc, involved in he light emitting element 100C shown in FIG. 12, need not be worried about so much. Also, since the transparent electrode 106 is not used, here is not the problem involved in the light emitting element shown in FIG. 10. That is, the light emitting element 100B shown in FIG. 11 has good current-voltage characteristics as shown in FIG. 2 as "Comparative Example (2)".

However, this element also involves the problem that, since specific resistance of the p-type GaAlAs layer 109 is not as low as that of the transparent electrode, the current injected through the electrode 107 does not spread uniformly over the entire emission surface of the element. To solve the problem, it is necessary to increase the thickness of the p-type GaAlAs layer 109 as thick as approximately 4 $\mu m$ or more so as to reduce the current-spreading resistance. However, the thicker layer requires a longer time for the crystal growth, and invites the problem of a higher manufacturing cost.

As reviewed above, in comparative semiconductor light emitting elements, it was difficult to obtain a sufficiently low resistance at the p-side, various approaches for overcoming it invited various problems, such as deterioration of characteristics caused by diffusion of zinc and an increase of the manufacturing cost, for example.

SUMMARY OF THE INVENTION

It is therefore an object of the invention to provide an InGaAlP semiconductor light emitting element operative with a lower voltage and ensuring higher output than conventional elements.

According to the invention, there is provided a semiconductor light emitting element comprising: an emission layer made of InGaAlP generating a light; a p-type contact layer made of a semiconductor doped with carbon as a p-type dopant; and a transparent electrode layer in contact with said p-type contact layer, said light generated at said emission layer being emitted through said transparent electrode.

In the present invention, a contact layer doped with a predetermined amount of carbon may be provided to decrease the contact resistance at the contact with the ITO electrode. Unlike zinc, carbon does not diffusion and does not deteriorate the property of the element.

An intermediate band gap layer having an intermediate band gap between those of the contact layer and the cladding layer may be interposed between the contact layer and the cladding layer to alleviate discontinuity between their valence bands, thereby promote inflow of holes and decrease the element resistance.

The present invention is used in the above-explained modes and performs the following effects.

According to the invention, by using the carbon-doped low-resistance ptype contact layer interposed between the p-type cladding layer and the transparent electrode, the contact resistance at the contact with the transparent electrode made of an n-type semiconductor can be reduced effectively, and the element resistance upon application of a forward voltage to the semiconductor light emitting element can be reduced.

Additionally, the p-type intermediate band gap layer interposed between the p-type cladding layer and the p-type contact layer and having an intermediate band gap between band gaps of these layers alleviates band discontinuity of their valence bands, thereby promotes inflow of holes, and further reduced the element resistance.

Moreover, the invention realizes a semiconductor light emitting element remarkably excellent in lifetime characteristics. That is, the invention uses carbon as the dopant for reducing the element resistance. Carbon does not readily diffuse in semiconductors, and removes the problem of deterioration in element characteristics caused by diffusion of the dopant into the active layer. Thus, the invention ensures remarkably excellent lifetime characteristics as compared with those of conventional light emitting elements using zinc.

Furthermore, the invention realizes a semiconductor light emitting element with a uniform emission intensity profile. That is, in conventional light emitting elements using a p-type GaAlAs current diffusion layer, specific resistance of GaAlAs is not as low as that of the transparent electrode, there was the problem that current does not spread uniformly over the entire emission surface. In contrast, the invention ensures sufficient diffusion of current throughout the area from the proximity of the electrode to the outermost peripheral portions of the light emitting element, and thereby promises a uniform emission intensity profile throughout the entirety of the emission surface of the light emitting element.

Simultaneously, the invention improves optical output of the light emitting element. It promises optical output as large as approximately 1.5 times of optical output of a conventional light emitting element.

Furthermore, as a result of remarkable reduction of the element resistance, temperature characteristics of the light emitting element is improved in the present invention. That is, since the heat generation caused by an element resistance decreases in he present invention, the element can be stabilized in operation under high temperatures. This results in enabling the use of semiconductor light emitting elements under various severe conditions heretofore unacceptable, and largely extending the field of applications of semiconductor light emitting elements.

As described above, the invention can provide an InGaAlP light emitting element reduced in element resistance and excellent in emission characteristics and lifetime characteristics, and its industrial merit is great.

BRIEF DESCRIPTION OF THE DRAWINGS

The present invention will be understood more fully from the detailed description given herebelow and from the accompanying drawings of the preferred embodiments of the invention. However, the drawings are not intended to imply limitation of the invention to a specific embodiment, but are for explanation and understanding only.

In the drawings.

DETAILED DESCRIPTION OF THE PREFERRED EMBODIMENTS

Explained below are some embodiments of the invention with reference to the drawings.

Figure 1:
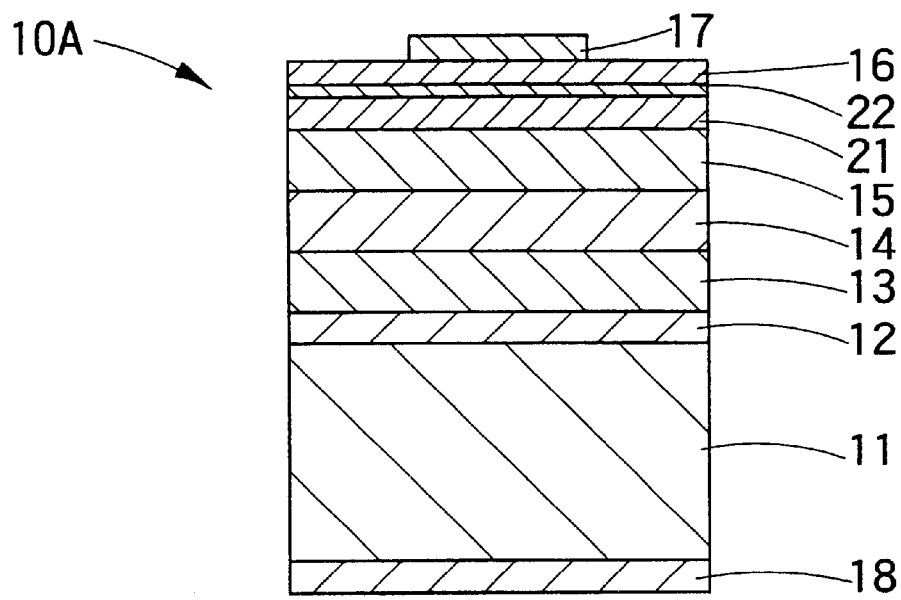
FIG. 1 is a cross-sectional view schematically showing construction of a semiconductor light emitting element according to the first embodiment of the invention.

FIG. 1 is a cross-sectional view schematically showing a semiconductor light emitting element according to the first embodiment of the invention. The light emitting element 10A shown here includes an n-type buffer layer 12, n-type cladding layer 13, active layer (emission layer) 14, p-type cladding layer 15, p-type intermediate band gap layer 21, p-type contact layer 22, and transparent electrode 16 sequentially stacked on an n-type GaAs substrate 11, and further formed are a p-side electrode 17 and an n-side electrode 18.

The p-type contact layer 22 is made of a semiconductor material having a relatively small band gap as compared with the cladding layer 15, and doped with carbon (C). Its material may be, for example GaAs.

The intermediate band gap layer 21 has an intermediate band gap between those of the p-type cladding layer 15 and the contact layer 22. Its material may be, for example, GaAlAs or InGaAlP, and can be selected appropriately depending on band gaps of the cladding layer 5 and the contact layer 22. Preferably, the intermediate band gap layer 21 is also doped with carbon to exhibit a p-type.

In this embodiment, the contact layer 22 made under the transparent electrode 16 and doped with carbon (C) remarkably decreases the resistance of the p-side, and thereby reduces the operation voltage of the semiconductor light emitting element. The intermediate band gap layer 21 alleviates discontinuity of valence bands and reduces the element resistance. Since carbon doped into these layers does not easily diffuse, deterioration of the element thereby need not be worried about.

Explained below is a method for manufacturing the light emitting element 10A according to the invention, with reference to a specific element structure. The semiconductor layers 12 through 22 on the GaAs substrate 11 can be made by epitaxially grown using metal organic chemical vapor deposition (MOCVD), for example.

Exemplary approximate thicknesses and materials of these layers are: 0.5 µm thick GaAs as the buffer layer 12, 0.6 µm thick InAlP as the n-type cladding layer 13, 0.3 µm thick InGaAlP as the active layer 14, 0.6 µm thick InAlP as the p-type cladding layer 15, 0.1 µm thick GaAlAs as the p-type intermediate band gap layer 21, 0.04 µm thick GaAs:C (doped carbon) as the p-type contact layer 22. Composition of the active layer 14 may be appropriately determined to adjust the emission wavelength to a predetermined wavelength band such as red, orange, yellow, yellow-green or green, for example. Composition of GaAlAs forming the intermediate band gap layer 21 is preferably determined to make an intermediate band gap between the band gaps of the cladding layer 15 and the contact layer 22.

Source materials usable in MOCVD are, for example, organic metals such as trimethyl gallium (TMG), trimethyl aluminum (TMA) and trimethyl indium (TMI), and hydride gases such as arsine ($AsH_3$) and phosphine ($PH_3$), for example.

The buffer layer 12 and the n-type cladding layer 13 are doped with silicon (Si) as an n-type impurity whereas the p-type cladding layer 15 is doped with zinc (Zn) as a p-type impurity. The intermediate band gap layer 21 and the contact layer 22 are doped with carbon (C) as a p-type impurity. Usable source materials of impurities such as silicon, zinc, carbon, etc. are, for example, silane ($SiH_4$), dimethyl zinc (DMZ) and carbon tetrabromide ($CBr_4$).

For crystal growth by MOCVD, the temperature is set at approximately 700° C. After growing respective layers, electrodes are formed, and the substrate is divided into chips to complete light emitting elements.

Usable as the material of the transparent electrodes 16 are optically transmitting, electrically conductive materials such as ITO (indium tin oxide), tin oxide and indiua oxide. These materials can be stacked by sputtering, for example.

Figure 2:
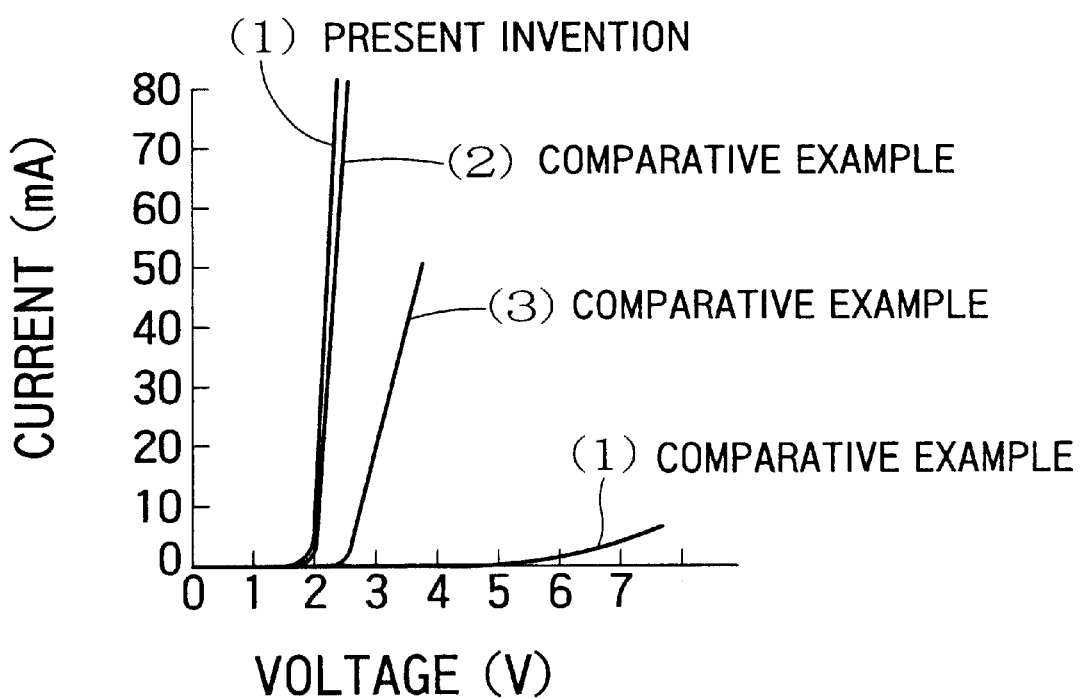
FIG. 2 is a characteristic diagram showing current-voltage characteristics of a semiconductor light emitting element 10A according to the invention.
Figure 10:
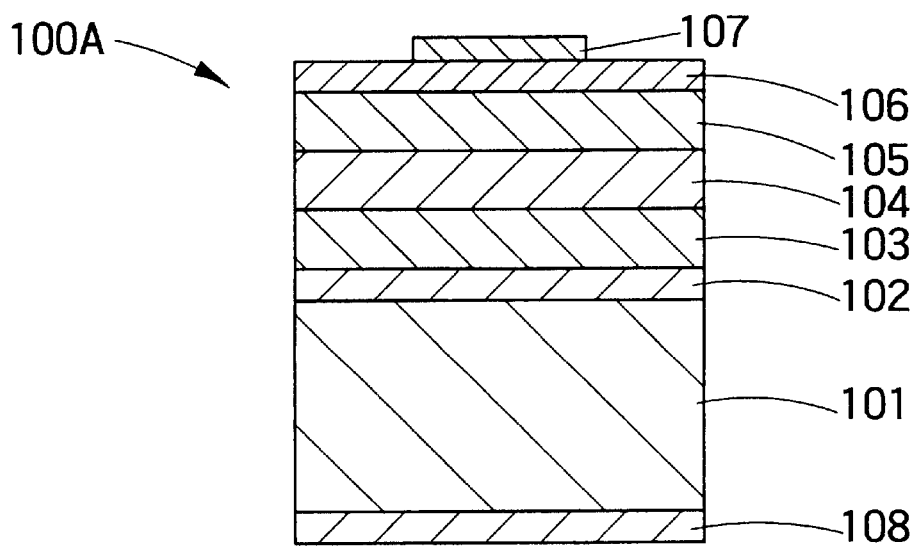
FIG. 10 is a cross-sectional view schematically showing a first comparative InGaAlP semiconductor light emitting element.
Figure 11:
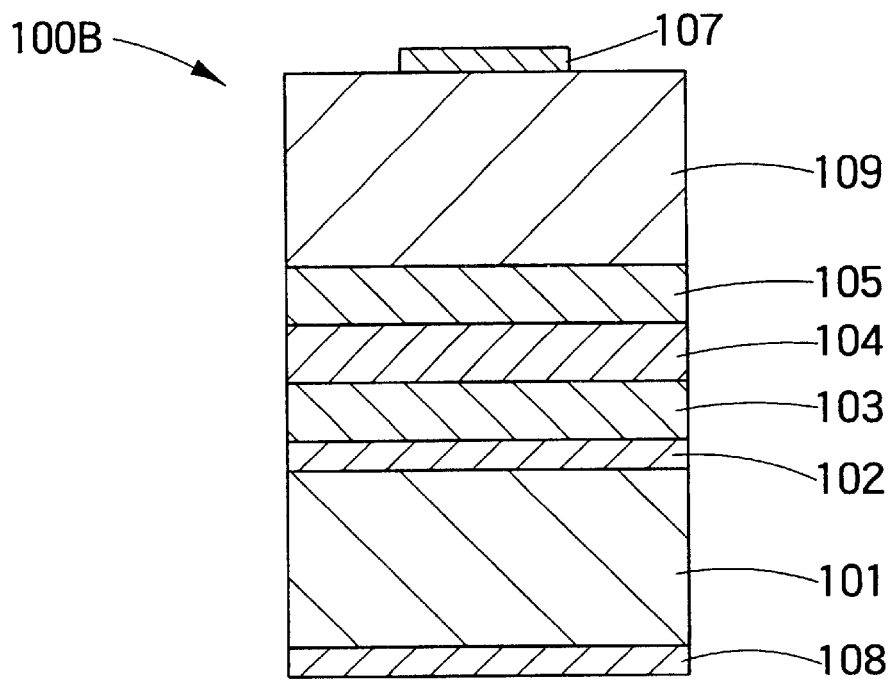
FIG. 11 is a cross-sectional view schematically showing a second comparative InGaAlP semiconductor light emitting element.

FIG. 2 is a diagram showing current-voltage characteristics of the semiconductor light emitting element 10A prepared in this manner. For the comparison purpose, FIG. 2 also shows characteristics of the comparative elements of FIGS. 10 through 12 as "Comparative Examples (1)" through "Comparative Examples (3)".

As understood from FIG. 2, in the semiconductor light element 10A according to the invention, the forward current suddenly increases under the voltage of approximately 2 V. That is, it exhibits current characteristics further more excellent than "Comparative Example (2)" which shows characteristics of the light emitting element 100B shown in FIG. 11 as having the thick p-type GaAlAs current diffusion layer 109.

A reason why the invention attains such good current-voltage characteristics lies in that the carbon-doped, low-resistance p-type GaAs contact layer 22 and the p-type GaAlAs intermediate band gap layer 21 are inserted between the p-type cladding layer 15 and the transparent electrode 16. The p-type contact layer 22 has the role of reducing the contact resistance with the transparent electrode 16. The intermediate band gap layer 21 functions to alleviate discontinuity between valence bands of the Stype GaAs contact layer 22 and the p-type InGaAlP cladding layer 15.

Figure 3:
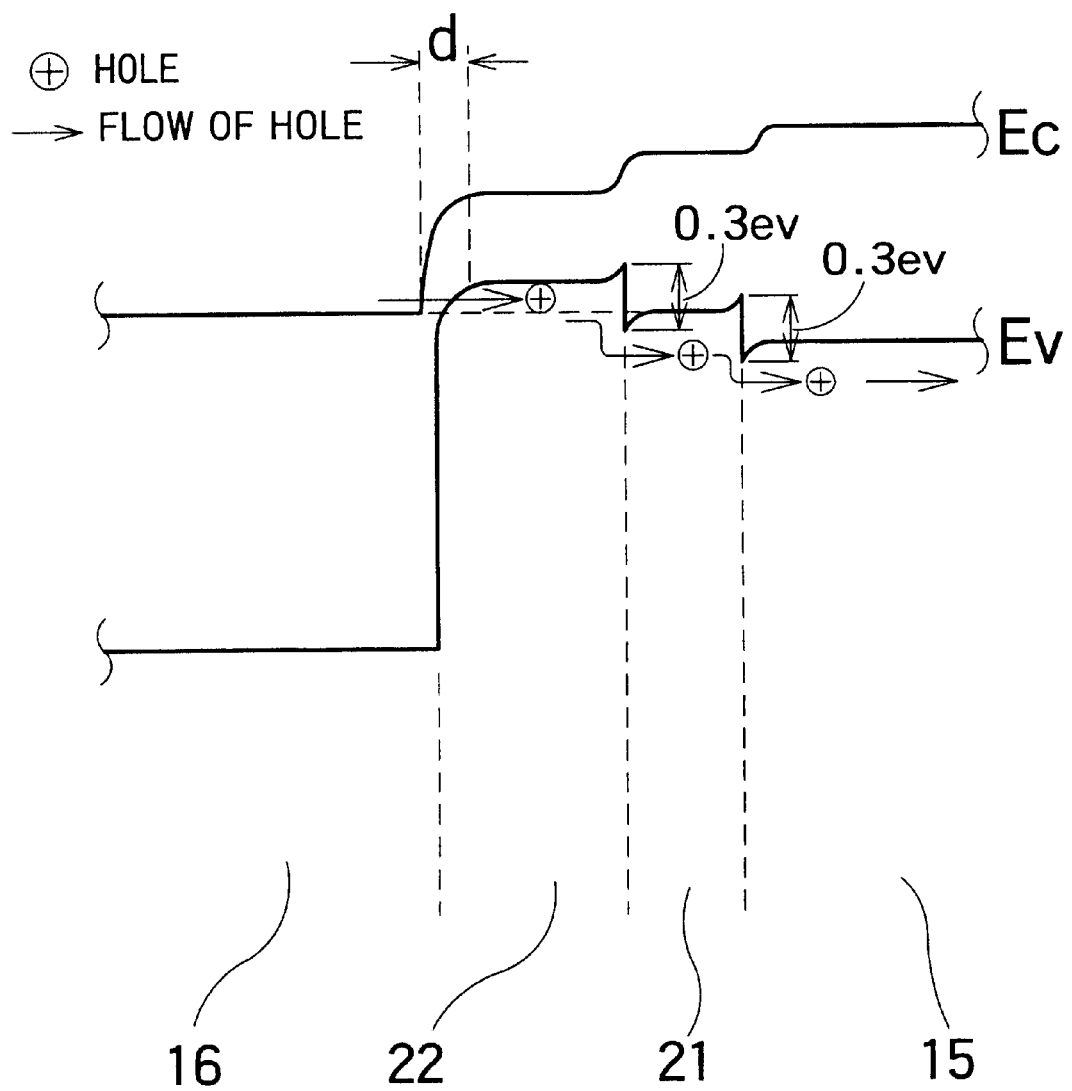
FIG. 3 is a diagram showing the band structure of the light emitting element 10A according to the invention.

FIG. 3 is a diagram schematically showing the band structure of the light emitting element 10A according to the invention. There is a difference of approximately 0.6 eV between valence band energies Ev of the contact layer 22 doped with a plenty of carbon and the p-type cladding layer 15. If these layers are formed in direct contact, a high barrier is made by the discontinuity of valence bands, and when a forward voltage is applied, inflow of holes is blocked, and the resistance increases. In contrast, the present invention interposing the semiconductor layer 21 having an intermediate band gap between the contact layer 22 and the cladding layer 15 alleviates the discontinuity of valence bands, thereby promotes inflow of holes as shown by arrows in FIG. 3, and successfully reduces the element resistance against the forward bias.

For example, if the cladding layer 15 is made of InAlP and the contact layer 22 is made of GaAs, the intermediate band gap layer 21 is preferably made of $Ga_{1-x}Al_xAs$ in which the mole fraction x of aluminum is selected in the range of 0.5 to 0.7. This range of composition decreases the discontinuity of valence bands at the junction between the cladding layer 15 and the intermediate band gap layer 22 and between the intermediate band gap layer 22 and the contact layer 22 to approximately 0.3 eV, and thereby reduces the element resistance sufficiently enough to promote inflow of holes.

Carbon is a preferable dopant of the intermediate band gap layer 21 because carbon does not easily diffuse and does not invite deterioration of characteristics, unlike zinc, as explained before. Its doping amount is preferably not less than $4 \times 10^{17}$ $cm^{-3}$ to prevent an increase of the element resistance.

If the doping amount of the contact layer increased, the thickness d of the depletion layer (barrier) between the electrode 16 and the contact layer 22 becomes thinner. When the thickness decreases to 0.01 μm approximately, holes completely tunnel the barrier, and nothing disturbs the inflow of holes. Therefore, the element resistance there remarkably decreases.

The element resistance can be reduced acceptably even when the thickness of the depletion layer decreases as thin as 0.01 μm or less. To confirm it, the Inventor actually made samples and evaluated them as explained below.

Figure 4A:
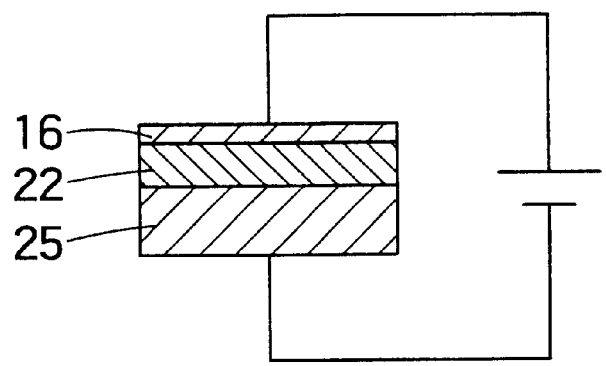
FIG. 4A is a diagram schematically showing construction of an element experimentally prepared for evaluation.
Figure 4B:
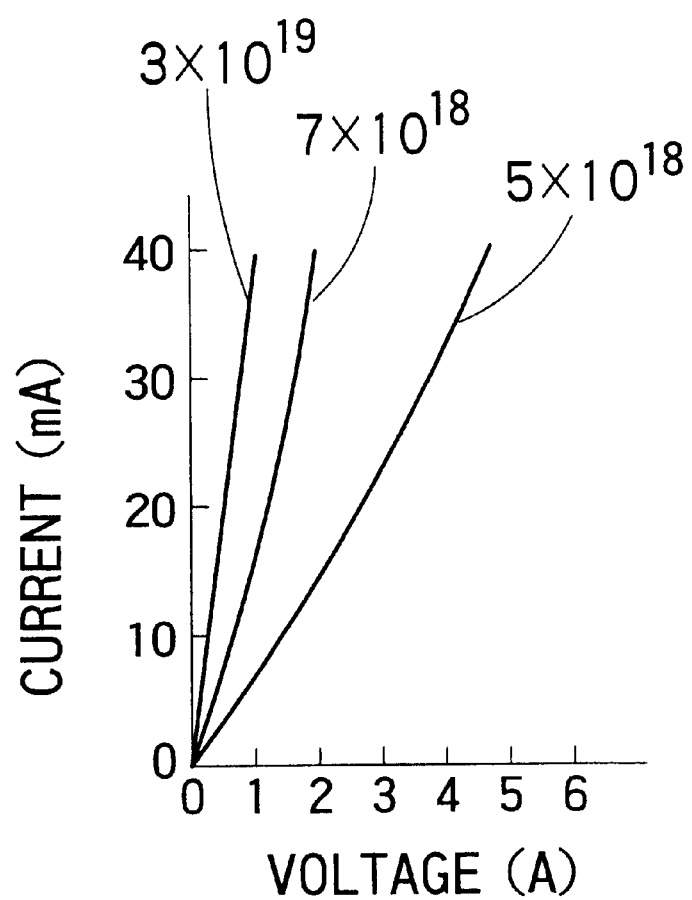
FIG. 4B is a graph showing current-voltage characteristics of the element for evaluation.

FIG. 4A is a diagram schematically showing construction of the evaluation element. FIG. 4B is a graph showing current-voltage characteristics of the evaluation element.

As shown in FIG. 4A, the sample element for evaluation has the structure stacking the contact layer 22 and the ITO electrode 16 on the p-type GaAs substrate 25. The doping amount of carbon into the contact layer 21 was changed as $5 \times 10^{18}$ cm$^{-3}$ and $3 \times 10^{19}$ cm$^{-3}$ to prepare three kinds of samples. The thickness of the p-type GaAs substrate 25 was approximately 250 μm. Then, a voltage was applied to these evaluation elements to be reversed at the junction of the ITO electrode 16 and the contact layer 21 as shown in FIG. 4A. The voltage polarity corresponds to a forward voltage in the light emitting element.

As a result, as shown in FIG. 4B, there was confirmed the tendency that, as the doping amount of carbon increases, the element resistance decreases, and with a doping amount of approximately $1 \times 10^{19}$ cm$^{-3}$ or higher, the element resistance suddenly decreases. That is, it has been confirmed that doping carbon in the amount of $1 \times 10^{19}$ cm$^{-3}$ or more can remarkably decrease the element resistance.

Next explained is how the light emitting element according to the invention is improved in surface emission profile and in optical output, comparing with comparative examples.

Figure 5:
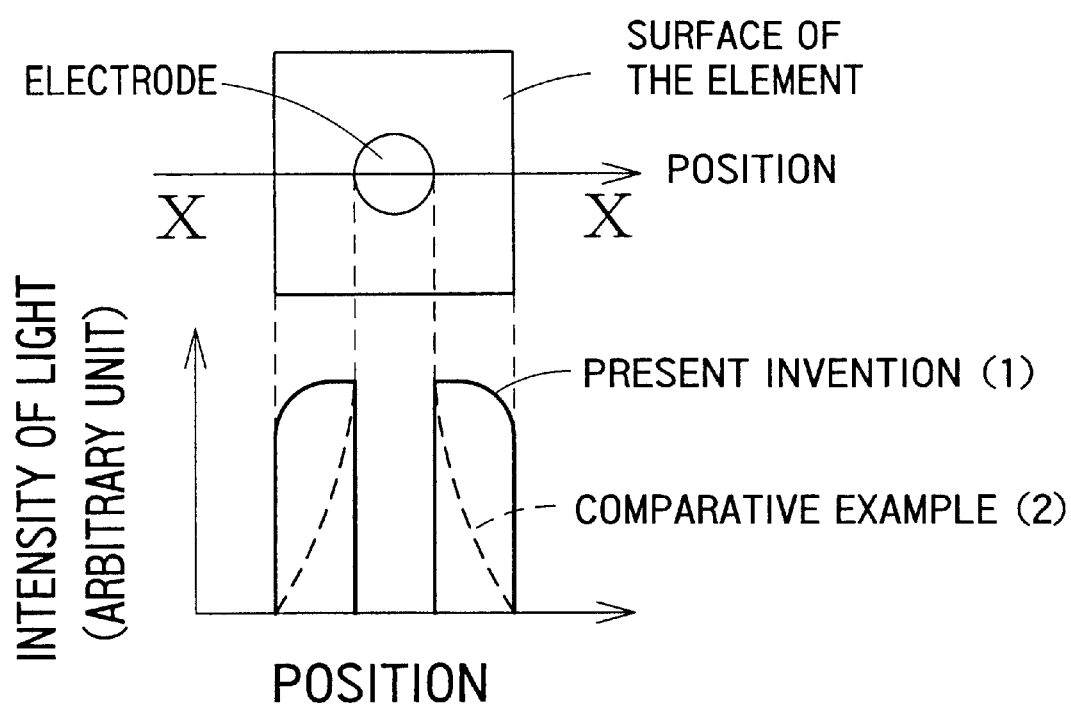
FIG. 5 is an explanatory diagram showing emission intensity profiles of light emitting elements, in combination of a plan view of the light emitting elements and a graph showing emission intensity profiles taken along their X—X lines.

FIG. 5 is an explanatory diagram of the emission intensity profile of the light emitting element. FIG. 5 shows, in combination, a rough plan view of the light emitting element and a graph showing its emission intensity profile taken along the X—X line of the plan view. FIG. 5 also shows characteristics of the light emitting element shown in FIG. 11 as "Comparative Example (2)" together with those of the light emitting element 10A according to the invention. The light emitting element as "Comparative Example (2)" has a p-type GaAlAs current diffusion layer 109 in lieu of a transparent electrode on the emission surface.

In Comparative Example (2), there is the problem that, since the specific resistance of the p-type GaAlAs layer 109 does not decreases as low as that of the ITO transparent electrode, the current does not spread uniformly over the entire emission surface. That is, as shown in the graph of FIG. 5, he emission intensity profile of Comparative Example (2) is not uniform. Additionally, although emission is intensive around the electrode, the current does not flow sufficiently to peripheral portions of the element, and the emission intensity suddenly decreases. In contrast, the intensity profile of the light emitting element 10A according to the invention is uniform over the entire emission surface, and the current spreads over a sufficient area from the proximity to the electrode to the outermost peripheral portions of the element, which evidences uniform and intensive emission.

According to the invention, along with such improvement in emission intensity profile, optical output of the element was also improved.

Figure 6:
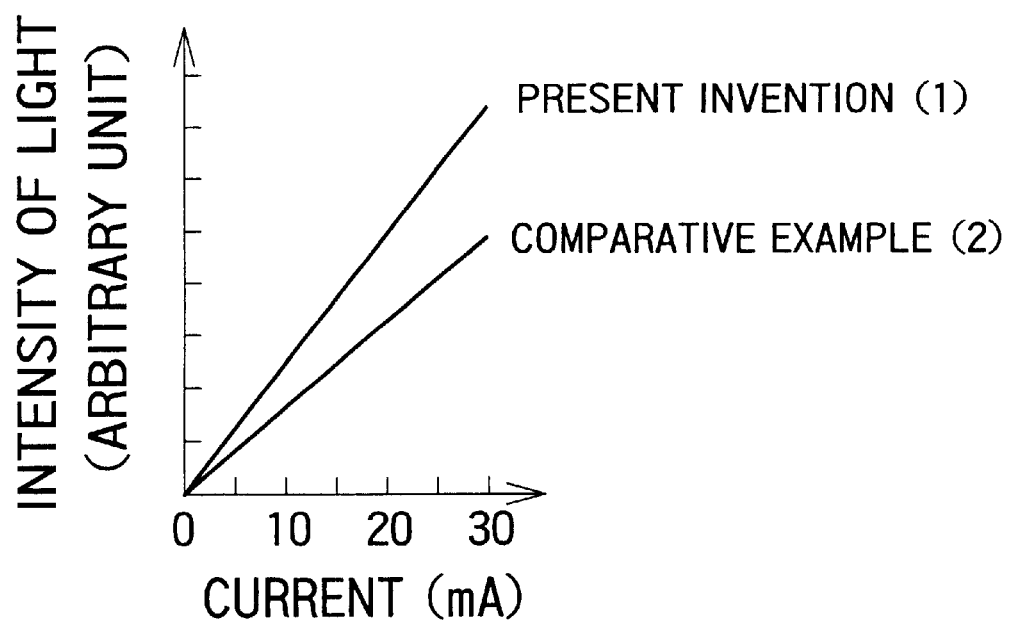
FIG. 6 is a graph showing optical output characteristics of light emitting elements, taking currents along the abscissa and optical outputs along the ordinate.

FIG. 6 is a graph showing optical output characteristics of the light emitting element. In FIG. 6, the abscissa shows the current, and ordinate shows the optical output. Here are also shown characteristics of the light emitting element shown in FIG. 11 as "Comparative Example (2)" together with those of the light emitting element 10A according to the invention. It is confirmed here that the light emitting element 10A according to the invention has been improved also in optical output together with the improvement in emission intensity profile, and exerts optical outputs as large as approximately 1.5 times the optical output of the light emitting element of Comparative Example (2).

Next explained is how the light emitting element according to the invention has been improved in lifetime characteristics, in comparison with comparative examples.

Figure 7:
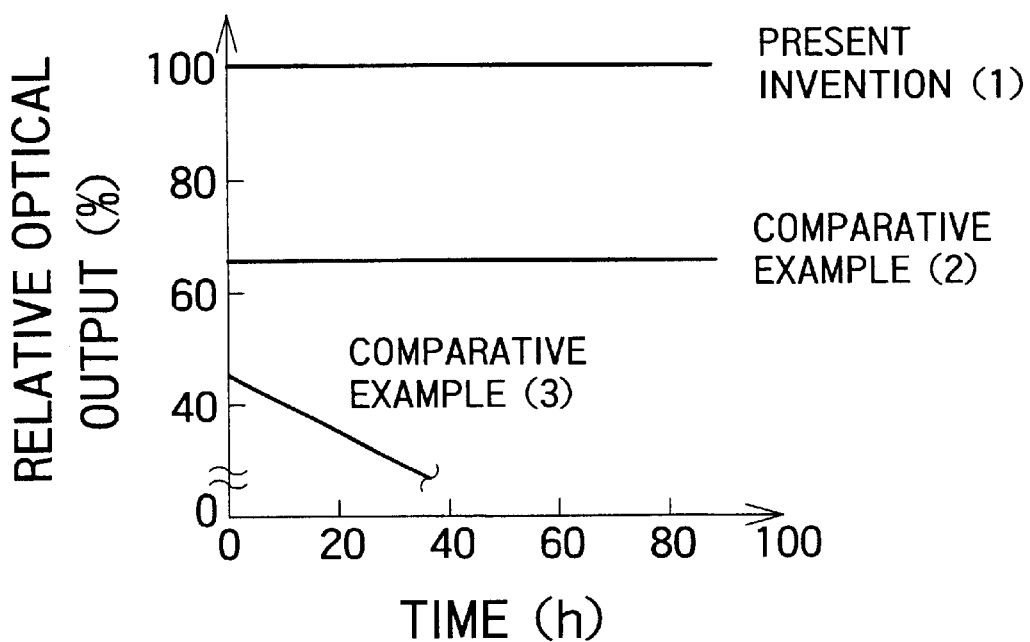
FIG. 7 is a characteristic diagram showing lifetime characteristics of the light emitting element 10A according to the invention and a comparative light emitting element.
Figure 12:
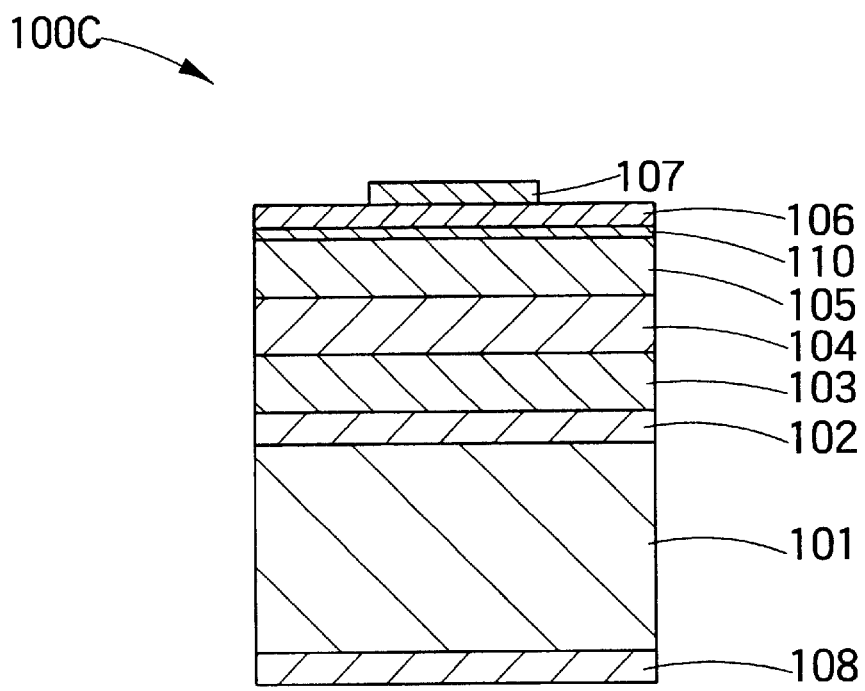
FIG. 12 is a cross-sectional view schematically showing a third comparative InGaAlP semiconductor light emitting element.

FIG. 7 is a diagram showing lifetime characteristics of the light emitting element 10A according to the invention and light emitting elements as Comparative Examples. Comparative Example (3) has a structure stacking the p-type GaAs low-resistance contact layer 110 doped with a large amount of zinc ($\sim 1 \times 10^{20}$ cm$^{-3}$) on the p-type cladding layer 105 as shown in FIG. 12. The element as Comparative Example (3) is weak in initial optical output as illustrated, and rapidly deteriorates due to dispersion of zinc.

In the element as Comparative Example (2), the p-type GaAlAs current diffusion layer 109 is used instead of a transparent electrode. Although the element of Comparative Example (2) exhibits relatively good lifetime characteristics as illustrated, the thick p-type GaAlAs current diffusion layer 109 increases the manufacturing cost.

In contrast to these Comparative Examples, the light emitting element 10A according to the invention is excellent also in initial characteristics of optical output, and very stable in lifetime. That is, the invention successfully reduces the element resistance and improves the emission output by doping a large amount of carbon instead of zinc into the p-type GaAs layer 22. Since carbon does not readily diffuses unlike zinc, even with a large amount of doped carbon, deterioration of element characteristics need not be worried about. As a result, good lifetime characteristics as shown in FIG. 7 can be obtained.

Next explained is the second embodiment of the invention.

Figure 8A:
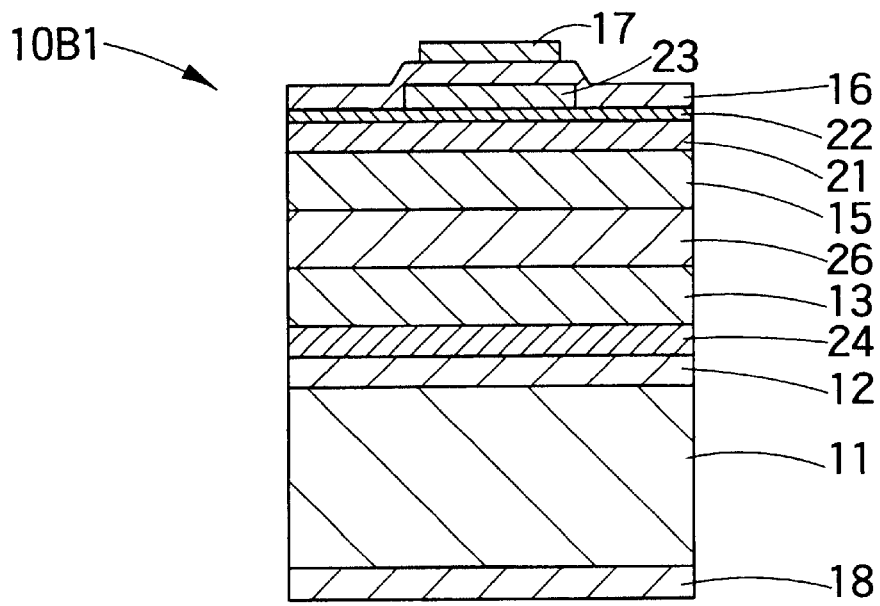
FIG. 8A is a cross-sectional view schematically showing construction of a semiconductor light emitting element according to the second embodiment of the invention.

FIG. 8A is a cross-sectional view schematically showing construction of a semiconductor light emitting element according to the second embodiment of the invention. The light emitting element 10B shown here also includes a plurality of semiconductors stacked on the n-type GaAs substrate 11. That is, sequentially stacked are the n-type GaAs buffer layer 12, n-type InGaAlP cladding layer 13, InGaAlP multi-quantum well active layer 26, p-type InGaAlP cladding layer 15, p-type GaAlAs intermediate band gap layer 21, p-type GaAs:C contact layer 22, and ITO (indium tin oxide) transparent electrode 16. Further formed are the p-side electrode 17 and the n-side electrode 18.

The embodiment shown here additionally includes a current blocking layer 23 between the p-type contact layer 22 and the ITO electrode 16. The current blocking layer 23 is selective formed to locally lie immediately under the p-side electrode 17 formed on the surface. Even when emission occurs under the p-side electrode, light is blocked by the p-side electrode 17 and cannot be taken out externally. In the embodiment shown here, having the current block layer 23, it is prevented to inject a current under the p-side electrode 17 to prevent useless emission, and thereby to improve the light extraction efficiency.

The embodiment shown here also has an optical reflection layer 24 under the n-type cladding layer 13. The optical reflection layer 24 reflects the downward emitted light from the active layer 14 to re-direct it upward. The optical reflection layer 24 may be a so-called Bragg multi-layered reflector in which two kinds of semiconductor layers different in refractive index are stacked alternately. More specifically, a multi-layered structure with 10 to 20 cycles of layers of InAlP/InGaAlP or InAlP/GaAs, for example, is desirable as the optical reflection layer 24.

The embodiment shown here uses the InGaAlP multi-quantum well active layer 26 as its emission layer on the n-type cladding layer 13, and thereby improves its emission output more than the use of the typical InGaAlP active layer 14.

Also in the embodiment shown here, there are formed the p-type contact layer 22 and the intermediate band gap layer 21 doped with carbon. Therefore, here are also ensured various effects such as remarkable reduction of the element resistance, uniform emission intensity, increase of optical output, improvement of the element lifetime, and so on, which were explained with reference to the light emitting element 10A according to the first embodiment.

Figure 8B:
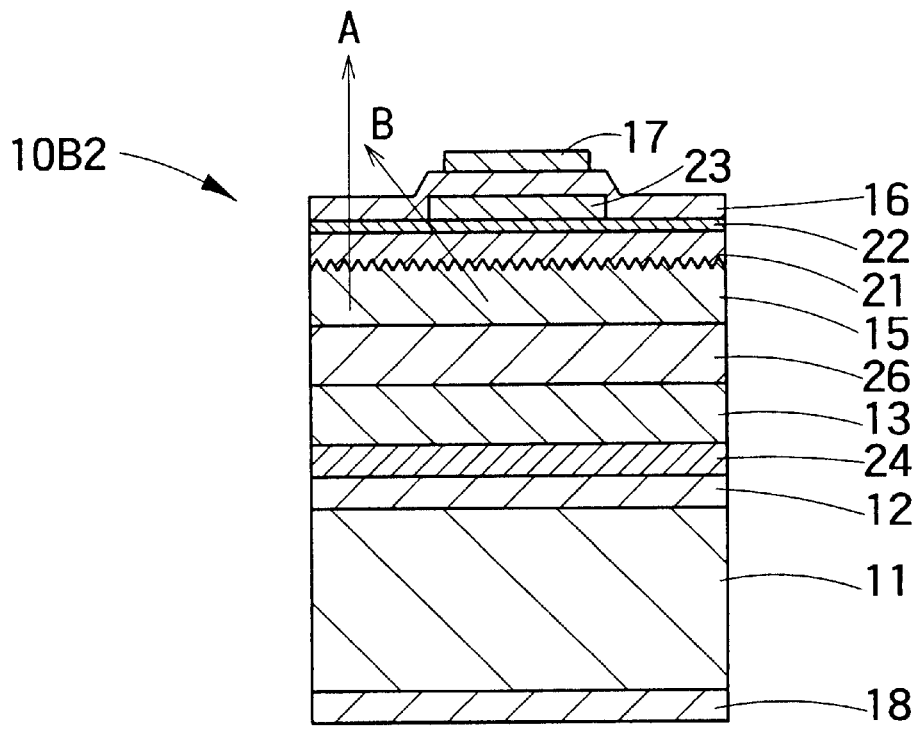
FIG. 8B is a cross-sectional view schematically showing a modified version of the element according to the second embodiment of the invention.

FIG. 8B is a cross-sectional view schematically showing a modified version of the instant embodiment. The semiconductor light emitting element 10B2 shown here also has a plurality of semiconductor layers on the n-type GaAs substrate 11. Components identical to those of the semiconductor light emitting element shown in FIG. 8A are labeled with common reference numerals, and their detailed explanation is omitted.

In the modified version shown here, the interface between the p-type InGaAlP cladding layer 15 and the p-type GaAlAs intermediate band gap layer 21 exhibits irregularity to improve the extraction efficiency of light emitted from the active layer 26 for the reason explained below.

In a double-hetero structure as shown here, refractive index of the cladding layer 15 is smaller than that of the intermediate layer 21 formed thereon. As a result, if the interface is flat and smooth, light emitted from the active layer 26 and entering aslant to the interface between the cladding layer 15 and the intermediate layer 21 is liable to be totally reflected, and extraction of light is disturbed.

In the modified version shown here, making the bumpy interface between the cladding layer 15 and the intermediate layer 21, ensures that light components entering aslant to the light extraction surface also pass through externally, depending upon angles of local planes where they enter. Additionally, totally reflected components of light repeat reflection by the irregular planes, and can pass through externally when occasionally entering irregular planes by normal angles smaller than the critical angles.

That is, as compared with the flat and smooth interface, the irregular interface increases the probability of entry of light by normal angles smaller than the critical angles. As a result, as shown by arrows A and B in FIG. 8B, the efficiency of external extraction of light emitted from the active layer 26, i.e., external quantum efficiency, can be improved.

The effect of these irregular planes can be obtained also when they are made along the interface between the intermediate layer 21 and the contact layer 22, or only on the surface of the contact layer 22, for example, instead of the interface between the cladding layer 15 and the intermediate layer 21.

Figure 8C:
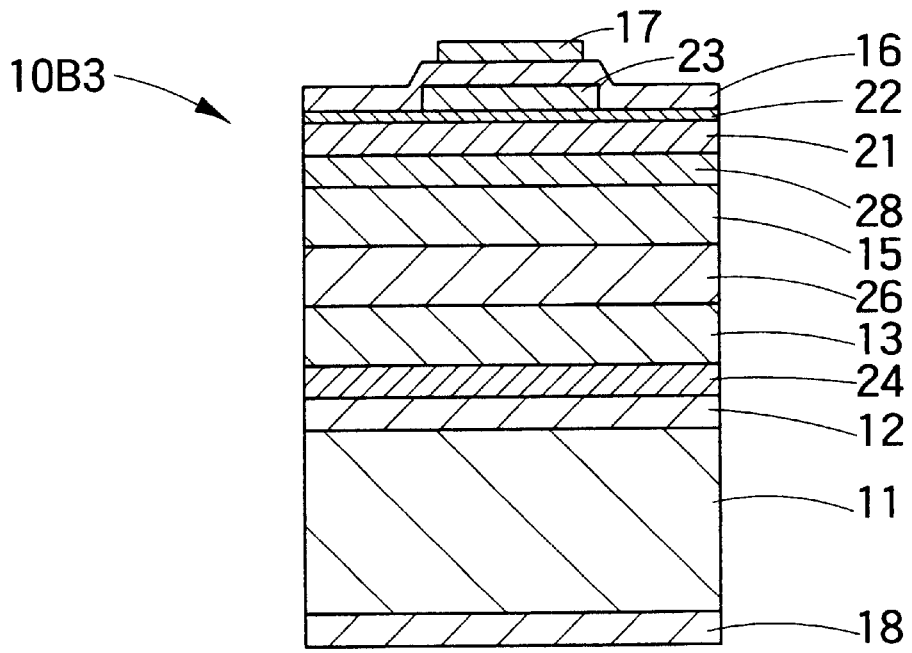
FIG. 8C is a cross-sectional view schematically showing another modified version of the element according to the second embodiment of the invention.
Figure 9:
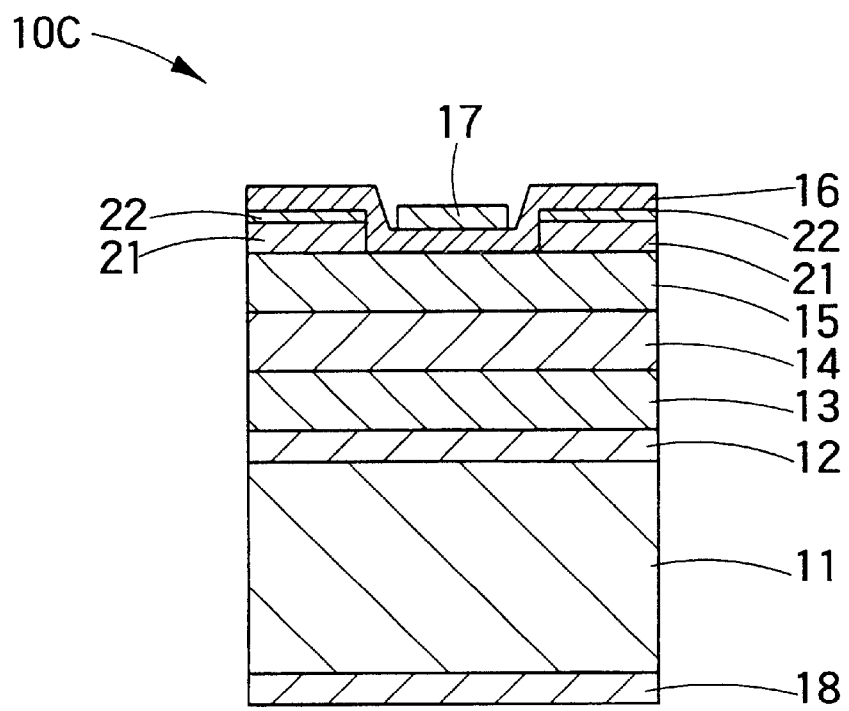
FIG. 9 is a cross-sectional view schematically showing a semiconductor light emitting element according to the third embodiment of the invention.

FIG. 8C is a cross-sectional view schematically showing another modified version of the instant embodiment. The semiconductor light emitting element 10B3 shown here also has a plurality of semiconductor layers stacked on the n-type GaAs substrate 11. Components therein identical to those of the semiconductor light emitting element shown in FIG. 8A are labeled with common reference numerals, and their detailed explanation is omitted.

In the modified version shown here, an optical reflection layer is made on the p-type InGaAlP cladding layer 15. Optical reflectance of the optical reflection layer 28 is set lower than that of the optical reflection layer 24 located below to permit light to pass through and be exerted upward through the ITO transparent electrode 16.

In the light emitting element as the modified version shown here, light emitted from the active layer 26 is resonated by the optical reflection layer 28 and the optical reflection layer 24 to sharpen the emission spectrum and improve the monochromy. This is called a resonant cavity LED, and it is an advantageous construction as LED for transmitting optical signals to optical fibers, for example.

Resonance between the optical reflection layers 24 and 28 may be strengthened to cause laser oscillation, thereby to realize a surface emitting laser element.

Such resonant LEDs and surface emitting laser elements also ensure the same various effects as mentioned with reference to FIGS. 1 through 7.

Next explained is a cross-sectional view schematically showing construction of a semiconductor light emitting element according to the third embodiment of the invention. The light emitting element 10C shown here also has a plurality of semiconductor layers stacked on the n-type GaAs substrate 11. More specifically, there are sequentially stacked the n-type GaAs buffer layer 12, n-type InGaAlP cladding layer 13, InGaAlP active layer 14, p-type InGaAlP cladding layer 15, p-type GaAlAs intermediate band gap layer 21, p-type GaAs:C contact layer 22 and ITO (indium tin oxide) transparent electrode 16. There are further formed the p-side electrode 17 and the n-side electrode 18.

In the embodiment shown here, the p-type contact layer 22 and the p-type intermediate band gap layer 21 are selectively removed immediately under the p-side electrode 17 to make it difficult for a current to flow immediately under the surface electrode. That is, the removed portion behaves as a pseudo-current block layer to improve the light extraction efficiency as the above-explained element according to the second embodiment.

The embodiment shown here also provides the p-type contact layer 22 and the intermediate band gap layer 21 doped with carbon around the electrode 17. Therefore, it also ensures various effects such as remarkable reduction of the element resistance, uniform emission intensity, large optical output, improvement of the element lifetime, which were explained with reference to the light emitting element 10A according to the first embodiment.

Heretofore, some embodiments of the invention have been explained, while referring to specific examples. The invention, however, is not limited to these examples. For example, structures of the semiconductor light emitting elements described above are not but some examples, and the invention is applicable to semiconductor light emitting elements having other various structures using InGaAlP semiconductors as their emission layers (active layers) to obtain the same effects. Also regarding materials and compositions of respective layers forming the semiconductor light emitting element, appropriate ones may be selected from known materials and compositions and used similarly.

For example, the active layer may be either as a so-called multi-quantum well (MQW) structure, as including an optical guide layer having an intermediate refractive index between the active layer and the cladding layer, or as a so-called graded structure in which the composition of he cladding layer is gradually changed.

While the present invention has been disclosed in terms of the preferred embodiment in order to facilitate better understanding thereof, it should be appreciated that the invention can be embodied in various ways without departing from the principle of the invention. Therefore, the invention should be understood to include all possible embodiments and modification to the shown embodiments which can be embodied without departing from the principle of the invention as set forth in the appended claims.

What is claimed is:

1. A semiconductor light emitting element comprising:
   an n-type cladding layer made of InGaAlP;
   an emission layer made of InGaAlP generating a light on said n-type cladding layer;
   a p-type cladding layer made of InGaAlP on said emission layer;
   a p-type contact layer made of GaAs over said p-type cladding layer, and doped with carbon as a p-type dopant; and
   a transparent electrode layer in contact with said p-type contact layer,
   said light generated at said emission layer being emitted through said transparent electrode.

2. The semiconductor light emitting element according to claim 1 wherein said p-type contact layer is doped with carbon in the amount of $1 \times 10^{19}$ cm$^{-3}$ or more.

3. The semiconductor light emitting element according to one of claim 1 further comprising an intermediate band gap layer interposed between said emission layer and said contact layer and made of a p-type semiconductor having a band gap larger than a band gap of said contact layer.

4. The semiconductor light emitting element according to claim 3 wherein said intermediate band gap layer is doped with carbon as a p-type dopant.

5. The semiconductor light emitting element according to claim 4 wherein said intermediate band gap layer is doped with carbon in the amount of $4 \times 10^{17}$ cm$^{-3}$ or more.

6. The semiconductor light emitting element according to claim 3 wherein said transparent electrode includes indium tin oxide as a main component.

7. A semiconductor light emitting element comprising:
   an n-type cladding layer made of InGaAlP;
   an emission layer made of InGaAlP on said n-type cladding layer;
   a p-type cladding layer made of InGaAlP on said emission layer;
   a p-type contact layer made of GaAs on said p-type cladding layer and having a band gap smaller than that of said p-type cladding layer and doped with carbon as a p-type dopant; and
   a transparent electrode layer in contact with said p-type contact layer.

8. A semiconductor light emitting element comprising:
   an n-type GaAs substrate;
   an n-type cladding layer made of n-type InAlP on said substrate;
   an emission layer made of InGaAlP on said n-type cladding layer;
   a p-type cladding layer made of p-type InAlP on said emission layer;
   a p-type contact layer on said p-type cladding layer made of a semiconductor having a band gap smaller than that of said p-type cladding layer and doped with carbon; and
   a transparent electrode layer in contact with said p-type contact layer.

9. The semiconductor light emitting element according to claim 7 wherein said p-type contact layer is doped with carbon in the amount of $1 \times 10^{19}$ cm$^{-3}$ or more.

10. The semiconductor light emitting element according to one of claim 7 further comprising an intermediate band gap layer interposed between said p-type cladding layer and said contact layer and made of a p-type semiconductor having a band gap smaller than that of said p-type cladding layer and larger than that of said contact layer.

11. The semiconductor light emitting element according to claim 10 wherein said intermediate band gap layer is made of AlGaAs.

12. The semiconductor light emitting element according to claim 11 wherein a mole fraction x of aluminum in $Al_xGa_{1-x}As$ of said intermediate band gap layer is selected in a range of 0.5 to 0.7.

13. The semiconductor light emitting element according to claim 10 wherein said intermediate band gap layer is doped with carbon as a p-type dopant.

14. The semiconductor light emitting element according to claim 13 wherein said intermediate band gap layer is doped with carbon in the amount of $4 \times 10^{17}$ cm$^{-3}$ or more.

15. The semiconductor light emitting element according to claim 10 wherein a interface between said p-type cladding layer and said intermediate band gap layer exhibits irregularity to improve the extraction efficiency of light emitted from said active layer.

16. The semiconductor light emitting element according to claim 10 further comprising a first optical reflection layer arranged under said n-type cladding layer to reflect a downward emitted light from said active layer upward.

17. The semiconductor light emitting element according to claim 16 further comprising a second optical reflection layer arranged on said p-type cladding layer and having a reflectance lower than a reflectance of said first optical reflection layer to resonate a light emitted from said emission layer by said first optical reflection layer and said second optical reflection layer.

18. The semiconductor light emitting element according to claim 10 further comprising a current blocking layer partially arranged between said p-type contact layer and said transparent electrode layer; and a metal electrode layer arranged on said transparent electrode layer so as to essentially overlap said current blocking layer, an injection of a current under said metal electrode being prevented by said current blocking layer in order to prevent useless emission and thereby improving a light extraction efficiency.

19. The semiconductor light emitting element according to one of claim 10 wherein said transparent electrode includes indium tin oxide as a main component.

* * * * *